(12) United States Patent
Sindhushayana et al.

(10) Patent No.: US 7,489,744 B2
(45) Date of Patent: Feb. 10, 2009

(54) TURBO DECODING METHOD AND APPARATUS FOR WIRELESS COMMUNICATIONS

(75) Inventors: Nagabhushana T. Sindhushayana, San Diego, CA (US); Jack K. Wolf, La Jolla, CA (US)

(73) Assignee: Qualcomm Incorporated, San Diego, CA (US)

( * ) Notice: Subject to any disclaimer, the term of this patent is extended or adjusted under 35 U.S.C. 154(b) by 1524 days.

(21) Appl. No.: 09/965,518

(22) Filed: Sep. 25, 2001

(65) Prior Publication Data

US 2003/0058969 A1 Mar. 27, 2003

(51) Int. Cl.
*H03D 1/00* (2006.01)
(52) U.S. Cl. .................. 375/340; 375/341; 375/262; 375/264; 714/804; 714/820; 714/752; 714/755; 714/786; 714/794; 714/795
(58) Field of Classification Search .......... 375/340, 375/345, 262, 264, 341; 371/43; 714/804, 714/820, 752, 755, 786, 794, 795
See application file for complete search history.

(56) References Cited

U.S. PATENT DOCUMENTS

| 5,442,627 | A |   | 8/1995 | Viterbi et al. ............... 370/22 |
| 5,446,747 | A | * | 8/1995 | Berrou ....................... 714/786 |
| 5,761,248 | A | * | 6/1998 | Hagenauer et al. .......... 375/340 |
| 5,933,462 | A |   | 8/1999 | Viterbi et al. ............... 375/341 |
| 6,023,783 | A | * | 2/2000 | Divsalar et al. ............. 714/792 |
| 6,182,261 | B1 |   | 1/2001 | Haller et al. ................ 714/758 |
| 6,292,918 | B1 |   | 9/2001 | Sindhushayana et al. .... 714/755 |
| 6,304,996 | B1 | * | 10/2001 | Van Stralen et al. ........ 714/796 |
| 6,307,901 | B1 | * | 10/2001 | Yu et al. ..................... 375/341 |
| 6,393,076 | B1 | * | 5/2002 | Dinc et al. .................. 375/341 |
| 6,829,313 | B1 | * | 12/2004 | Xu ............................ 375/341 |
| 2003/0123563 | A1 | * | 7/2003 | Lu ............................ 375/265 |
| 2004/0240590 | A1 | * | 12/2004 | Cameron .................... 375/340 |

OTHER PUBLICATIONS

Felix Lustenberger, "On the Design of Analog VLSI Iterative Decoders", Ph. D. dissertation Swiss Federal Institute of Technology, Zürich, Nov. 2000, pp. 42.*
Chung, et al. "Analysis of Sum-Product Decoding of Low-Density Parity-Check Codes Using a Gaussian Approximation" IEEE Transactions on Information Theory 47(2): 657-670 (2001).
Worm et al. "A High-Speed Map Architecture With Optimized Memory Size and Power Consumption," 2000 IEEE Workshop on signal processing systems. SIPS 2000, Oct. 11, 2000, pp. 265-274.

(Continued)

*Primary Examiner*—Juan A Torres
(74) *Attorney, Agent, or Firm*—Stanton Braden; Ken Vu; Thomas R. Rouse

(57) ABSTRACT

In a communication system 10, a method and apparatus provide for decoding a sequence of turbo encoded data symbols. The channel nodes $R_x$, $R_y$ and $R_z$ are updated based on a received channel output, and the outgoing messages from symbol nodes (701, 707, 708) are initialized. The symbol nodes symbol nodes (701, 707, 708) are in communication with the channel nodes $R_x$, $R_y$ and $R_z$. Updates of computational nodes C (704) and D (706) at different time instances are performed in accordance with a triggering schedule.

13 Claims, 6 Drawing Sheets

OTHER PUBLICATIONS

Pietrobon. "Implementation and Performance of a Turbo/Map Decoder," International Journal of Satellite Communications, John Wiley & Sons, Ltd., U.S. vol. 16, No. 1, 1998, pp. 23-46.

Felix Lustenberger, "On the Design of Analog VLSI Iterative Decoders", Ph. D. dissertation Swiss Federal Institute of Technology, Zürich, Nov. 2000, pp. 42.

* cited by examiner

TURBO DECODING METHOD AND APPARATUS FOR WIRELESS COMMUNICATIONS

FIELD

The present invention relates to a field of communications, and more particularly wireless communications.

BACKGROUND

Error control codes provide redundancy in communications of a sequence of data symbols, which are exploited at a receiving end for reproducing the original sequence of data symbols in presence of noise and interference. Convolutional codes with Viterbi decoders have been used extensively to achieve reliable communication over power limited channels and interference limited channels in CDMA wireless communication systems. A new class of error correcting codes called turbo code provides further increase in performance over the classical codes. The decoding process for turbo code at a receiver involves iterative algorithms, which are complex and computationally intensive for the receiver.

Therefore, there is a need in the art for an improved decoder in a communication system where turbo code is used.

SUMMARY

In a communication system, a method and apparatus provide for decoding a sequence of turbo encoded data symbols. Various aspects of the invention are represented by a graph consisting of various nodes and the connecting branches. The nodes are of different types including channel node, symbol node, state node and computational node. The branches connecting the nodes allow flow of messages from one node to another. The nodes and branches may be implemented via software, hardware or a combination of both. A node may be updated by sending an outgoing message having a value based on the values of the incoming messages. In one embodiment, the channel nodes $R_x$, $R_y$ and $R_z$ are updated based on a received channel output and the outgoing messages from symbol nodes are initialized. The symbol nodes are in communication with the channel nodes $R_x$, $R_y$ and $R_z$. Updates of the computational nodes C and D are performed in accordance with a triggering schedule. In one embodiment, the updates of the computational nodes C and D are triggered concurrently for all possible time instances. The triggering schedule may be repeated to obtain one or more iterations of the decoding process. After one or more iterations, the symbol nodes hold a value for the decoded symbols. The decoding process, as a result, is performed efficiently, accurately and expeditiously.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Various embodiments of the invention may be incorporated in a wireless communication system operating in accordance with the code division multiple access (CDMA) technique which has been disclosed and described in various standards published by the Telecommunication Industry Association (TIA), Third Generation Partnership Project (3GPP) arid Third Generation Partnership Project 2 (3GPP2) Such standards include the TIA/EIA-95 standard, TIA/EIA-IS-856 standard, IMT-2000 standards (including cdma2000 standards and WCDMA standards), all incorporated by reference herein. A copy of the standards may be obtained by writing to TIA, Standards and Technology Department, 2500 Wilson Boulevard, Arlington, Va. 22201, United States of America. The standard generally identified as WCDMA standard, incorporated by reference herein, may be obtained by contacting 3GPP Support Office, 650 Route des Lucioles-Sophia Antipolis, Valbonne-France.

Generally stared, a novel and improved method and an accompanying apparatus provide for efficient decoding of a sequence of encoded data symbols in a communication system. One or more exemplary embodiments described herein are set forth in the context of a digital wireless data communication system. While use within this context is advantageous, different embodiments of the invention may be incorporated in different environments or configurations. In general, the various systems described herein may be formed using software-controlled processors, integrated circuits, or discrete logic. The data, instructions, commands, information, signals, symbols, and chips that may be referenced throughout the application are advantageously represented by voltages, currents, electromagnetic waves, magnetic fields or particles, optical fields or particles, or a combination thereof. In addition, the blocks shown in each block diagram may represent hardware or method steps.

Figure 1:
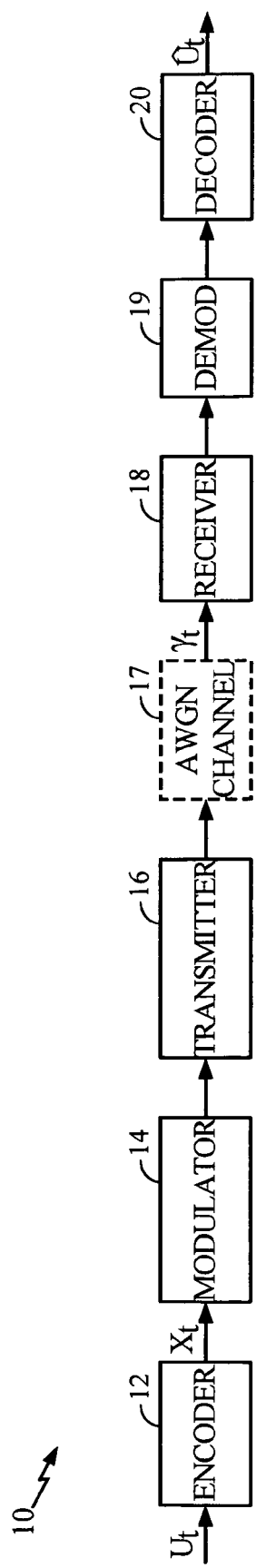
FIG. 1 illustrates a communication system capable of operating in accordance with various embodiments of the invention.

FIG. 1 is a block diagram of a communication system 10 including a transmitter and a receiver for operation over a channel. At the transmitting end, system 10 includes an encoder 12 for receiving an input data sequence for an encoding operation. Encoder 12 outputs an encoded data sequence to the modulator 14. The modulator 14 modulates the encoded data sequence over a carrier signal. The modulator 14 provides the resulting signal to a transmitter 16. The transmitter 16 may include a power amplifier and an antenna necessary to transmit the signal over an additive white Gaussian noise (AWGN) channel 17. A receiver 18 receives the signal. The received signal is demodulated by a demodulator 19 and forwarded to a decoder 20. The decoder 20 outputs an estimate of the input data sequence. The operation of the modulator 14, transmitter 16, receiver 18 and demodulator 19 may be in accordance with a known technique in a relevant art.

Encoder 12 may include a convolutional encoder for encoding at a coding rate (k/n) corresponding to the number of coded symbols (n) in a codeword produced for a number of input data bits (k). A constraint length (K) is also defined as the length of a shift register used in a convolutional encoding of data. The convolutional encoder may operate as a Finite Impulse Response filter with binary coefficients and length K−1. The encoder may have 2 to the power of (K−1) possible states.

Figure 2:
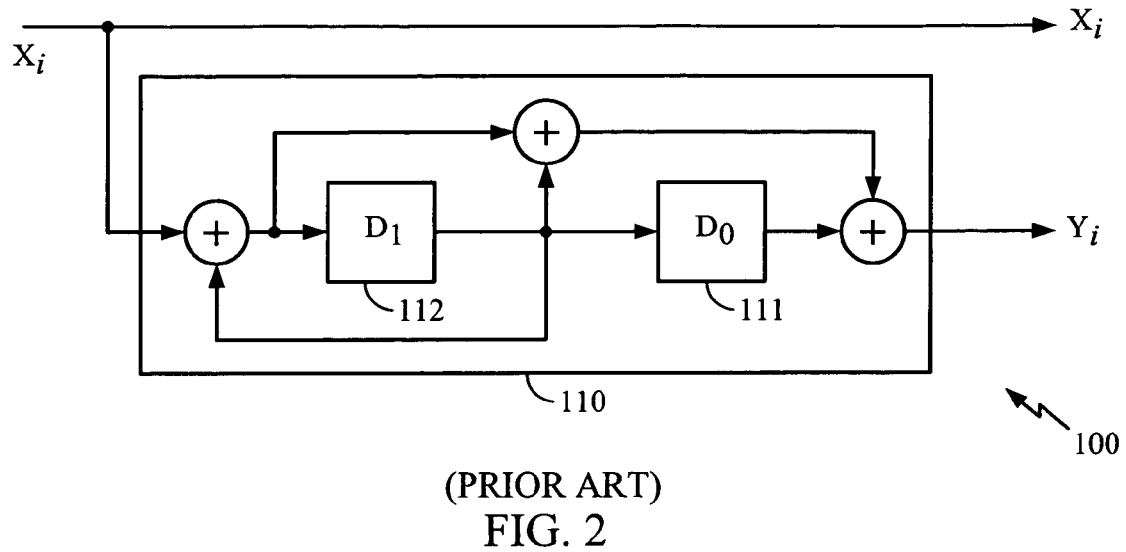
FIG. 2 illustrates a block diagram of an encoder.

Referring to FIG. 2, a block diagram of a convolutional encoder 100 for use in system 10 in accordance with an embodiment is shown. Encoder 100 inputs data symbols $X_i$ and outputs a codeword consisting of encoded symbols $X_i$ and $Y_i$. Therefore, the encoding is at a coding rate ½. The subscript "i" is an index representing an instance of time. An encoder 110 encodes the input data symbol $X_i$ in accordance with a polynomial to produce the data symbol $Y_i$. The polynomial may be in accordance with a convolutional code. The implementation of such a polynomial may include binary flip-flops 111 and 112. Binary flip-flops 111 and 112 may be at respectively states "D0" and "D1." States D0 and D1 may be either a state "0" or "1" at any instance of time. In system 10, encoded data symbols $X_i$ and $Y_i$ are transmitted to receiver 18 over an AWGN channel 17.

Although it is not necessary, it is useful in understanding either the code characteristics or the performance of the optimal decoder to exhibit the code on a trellis diagram. A trellis diagram is an infinite replication of the state diagram for an encoder. The nodes (states) at one level in the trellis are reached from the nodes (states) of the previous level by the transition through one branch, corresponding to one input bit, as determined by the state diagram. Several types of metrics, such as state metrics, path metrics and branch metrics, may be used in the decoding process. The most probable path may be selected with a high degree of certainty. The codewords corresponding to the symbols of each branch of the selected path are the most likely set of codewords transmitted.

Figure 3:
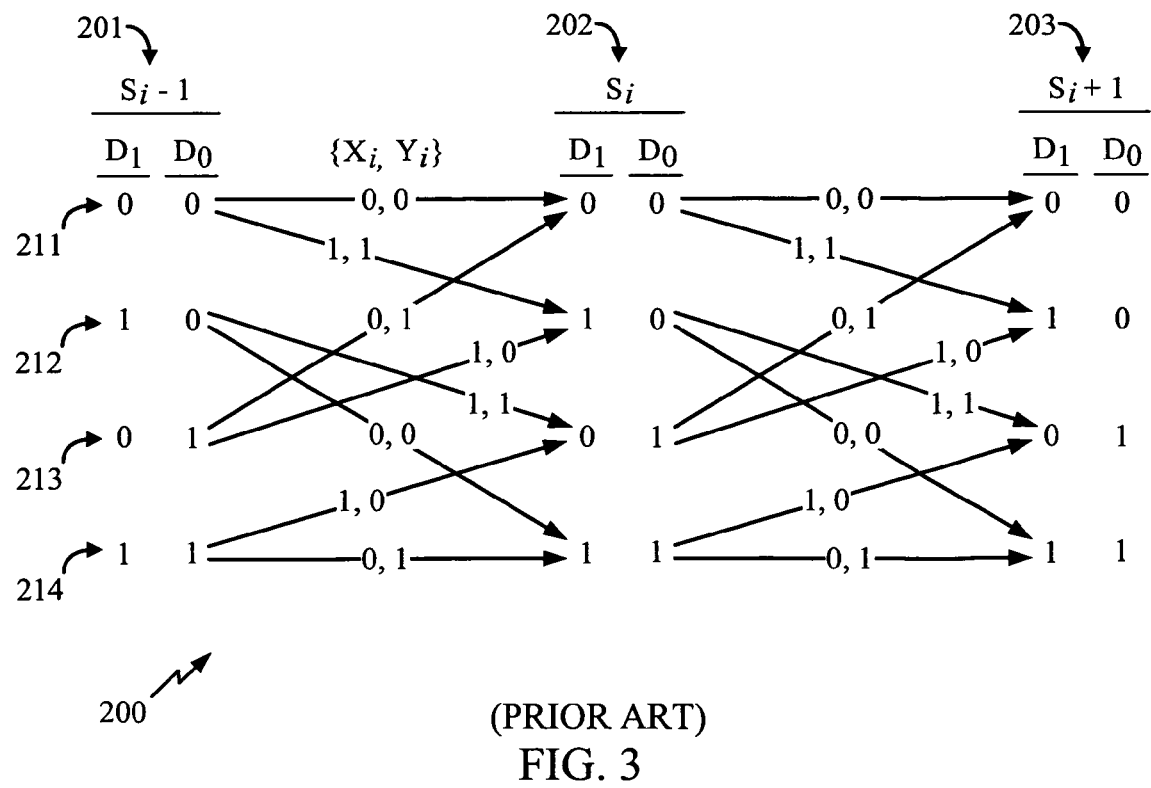
FIG. 3 illustrates a trellis diagram.

Referring to FIG. 3, a trellis 200 is shown for decoding at decoder 20 the received encoded data symbols $X_i$ and $Y_i$. The trellis 200 shows state spaces 201, 202 and 203 for, respectively, states of the flip-flops 111 and 112 at time instances "i−1", "i" and "i+1." Four possible states 211, 212, 213 and 214 are associated with each state space as shown in the exemplary embodiment. For example, states 211, 212, 213 and 214 indicate the state of the flip-flops 111 and 112 to be, respectively, at possible states "00", "10", "01" and "11." A transition from a state in a state space to another state in another state space is shown by different possible codeword branches. Each branch represents a specific choice for the encoded symbols $X_i$ and $Y_i$. For example, codeword branch "01" represents a "0" value for data symbol $X_i$ and a "1" value for data symbol $Y_i$. Codeword branch "01" may show the transition of the flip-flops 111 and 112 from state 213 in a state space at an instance of time to state 211 in another state space at the next instance of time, and from state 214 in a state space at an instance of time to state 214 in another state space at the next instance of time. For a rate ½, each state at each state space may be reached by at least two possible codeword branches.

In accordance with various embodiments, a correlator in demodulator 19 may determine the probability of each received encoded data symbol based on a channel output. The probability associated with each received encoded data symbol may be stored in a memory element. The determined probability for each data symbol $X_i$ and $Y_i$ is used to determine a branch metric (channel metric).

An algorithm commonly known as Maximum Aposteriori Probability algorithm may be used in the decoding process. The decoding process in trellis 200 may include determining state metrics and path metrics from the initial state space and final state space at the same time in a forward and backward fashion. A soft decision determines the values of the encoded data symbols $X_i$ and $Y_i$ as represented by the branches at time instances corresponding to the state spaces in the trellis. To make a soft decision for the values of the encoded data symbols $X_i$ and $Y_i$, a dual metric (DM) of each branch is determined. The DM of a branch is based on a forward state metric (FSM), a backward state metric (BSM) and a branch metric (BM). The DM may be a summation of FSM, BSM and BM. BM of a branch may be determined based the channel output.

FSM of a state may be based on a forward path metric (FPM). FPM at an end of a branch may be equal to the sum of FSM of the state at the beginning point of the branch and the BM of the branch. The FSM of the states at the initial state space of the trellis may be known or pre-determined. FSM of a state, other than the states at the initial state space of the trellis, may be equal to a generalized minimum of FPM of the paths starting from the initial state space and terminating at the state. BSM of a state may be based on a backward path metrics (BPM). BPM at an end of a branch may be equal to BSM of the state at the beginning point of the branch and the BM of the branch. The BSM of the states at the final state space of the trellis may be known or pre-determined. BSM of a state, other than the states at the final state space of the trellis, may be equal to a generalized minimum of BPM of the paths starting at the state and ending at the states of the final state space. In this manner, the FSM, BSM, and BM of the state spaces from an initial state and a final state may be determined in a sequential manner until the paths from both directions reach the opposite end to determine DM for all the branches. DM of a branch may be based on the FSM of the state at an end of the branch from the forward direction, BSM of the state at an end of the branch from the backward direction and BM of the branch.

DM of the branches between two successive state spaces may be grouped into two groups. The first group consisting of the branches with codewords that have an $X_i$ symbol equals to "0." The second group consisting of the branches with codewords that have an $X_i$ symbol equals to "1." A generalized minimum of the first group (GMB0) and a generalized minimum of the second group (GMB1) are determined. The soft decision for the $X_i$ symbol may be equal to a difference between GMB0 and GMB1. The soft decision for other data symbols of the codeword may be determined similarly by grouping the branches into two groups. The first group may be having the data symbol equals to "0" and the second group equals to "1". The soft decision for the data symbol may be equal to the difference between the GMB0 and GMB1.

Each branch of trellis represents a codeword consisting of a number of data symbols. For example, for an encoding rate ½, the codeword in each branch shown in trellis 200 indicates a value for the data symbols $X_i$ and $Y_i$. If the encoder in the transmitter transmits encoded data symbols at an encoding rate ⅓, three data symbols may be produced for every input data symbol. In such an example, the codeword in each branch represents three data symbols.

Figure 4:
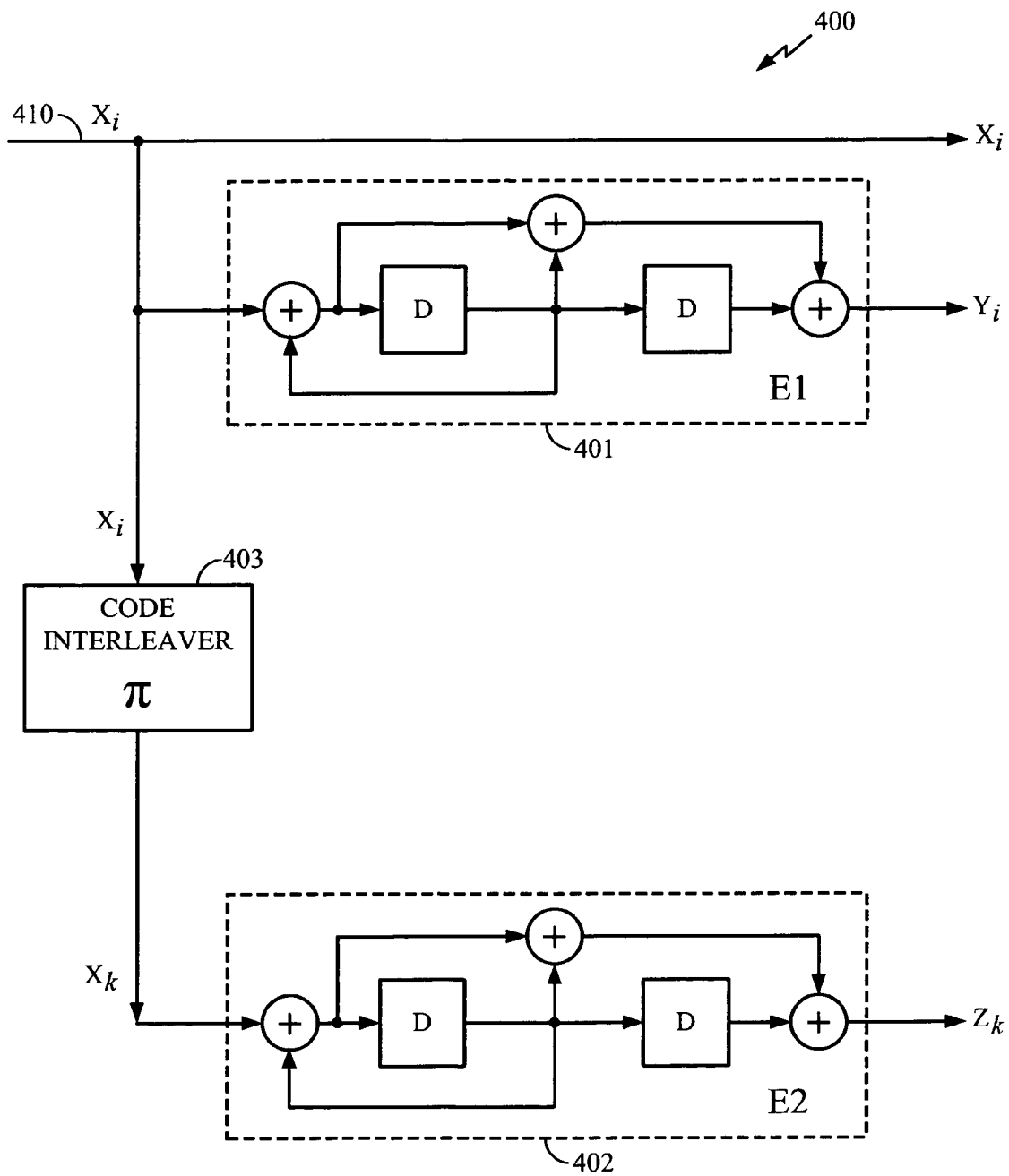
FIG. 4 illustrates a block diagram of a turbo encoder.

Referring to FIG. 4, a general block diagram of a conventional rate ⅓ turbo encoder 400 is shown. Generally speaking, a rate ⅓ turbo encoder includes at least two parallel encoders. Turbo encoder 400 includes a first constituent code 401 and a second constituent code 402 and a code interleaver 403. Data symbols $X_i$ input turbo encoder 400 at an input 410. The first constituent code 401 inputs data symbols $X_i$ to produce encoded data symbols $Y_i$. Code interleaver 403 receives data symbols $X_i$ for interleaving the data symbols $X_i$ to produce data symbols $X_k$. Data symbols $X_k$ may consist of rearranged data symbols $X_i$. The second constituent code 402 encodes data symbols $X_k$ and outputs data symbols $Z_k$. The polynomial used for encoding data symbols in the first and second constituent codes 401 and 402 may be the same or different. The encoding in the first and second constituent codes 401 and 402 may according to the convolutional code 110 shown in FIG. 2.

Data symbols $X_i$, $Y_i$ and $Z_k$ may pass to a puncturing block (not shown) for selecting data symbols for transmission. The selection may be according to a puncturing pattern. The selected data symbols are exclusively from data symbols $X_i$, $Y_i$ and $Z_k$. In system 10, the selected data symbols pass to the modulator 14 for modulation and transmission to receiver 18. Decoder 20 receives the noisy version of data symbols $X_i$, $Y_i$ and $Z_k$.

Figure 5:
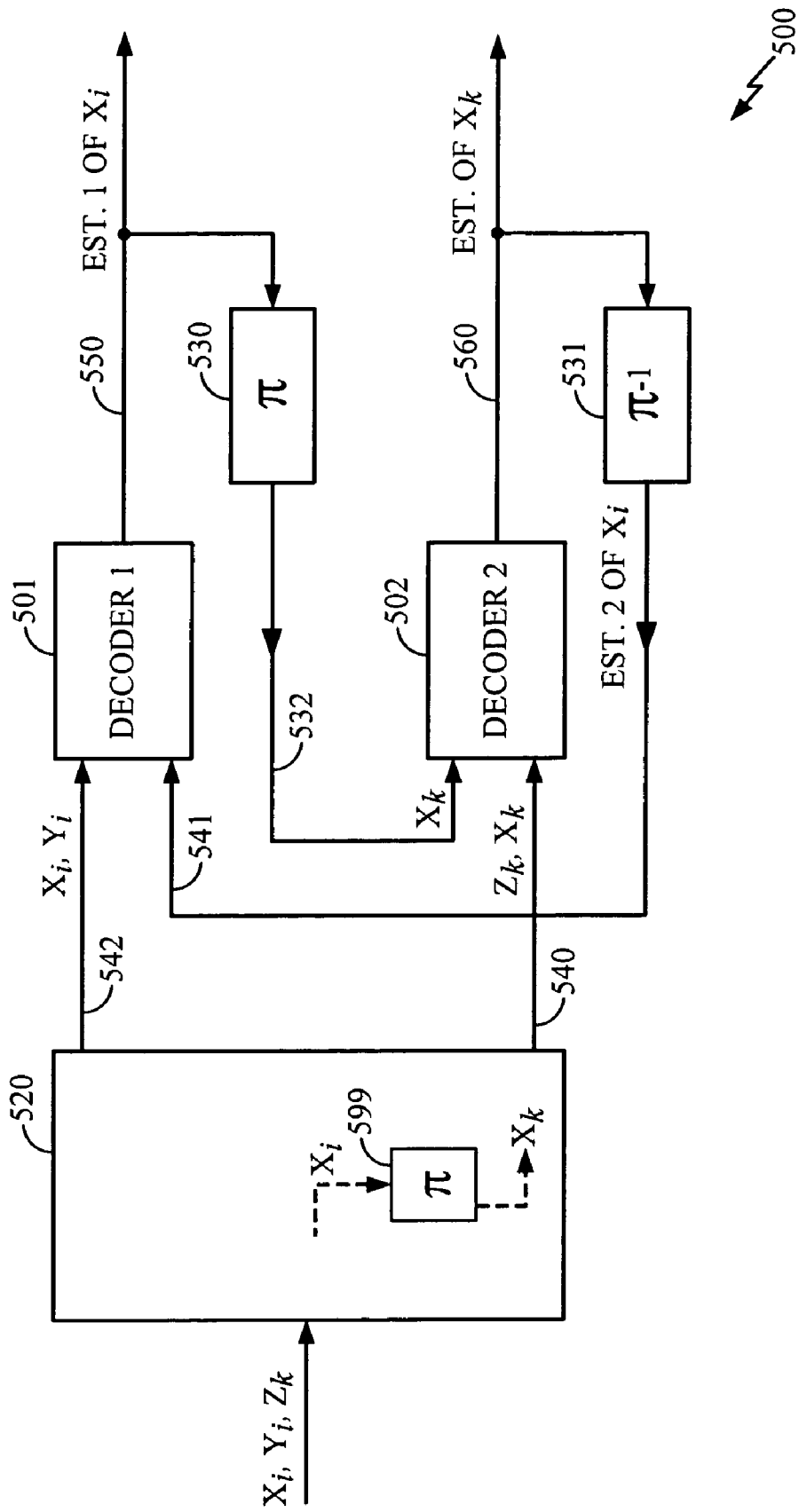
FIG. 5 illustrates a block diagram of a decoder.

Referring to FIG. 5, a block diagram of a decoder 500 is shown for decoding the noisy version of data symbols $X_i$, $Y_i$ and $Z_k$ to produce estimates of data symbols $X_i$. Decoder 500 may be used in decoder 20 of system 10. The noisy version of encoded data symbols $X_i$, $Y_i$ and $Z_k$ may pass through a data symbol selector block 520 which operates to select the noisy version of data symbols $X_i$ and $Y_i$ for routing to a decoder block 501 at an input 542. The noisy version of data symbols $X_i$ internally passes through an interleaver 599 to locally reproduce a noisy version of data symbols $X_k$. The locally produced noisy version of data symbols $X_k$ and $Z_k$ pass to a decoder block 502 at an input 540. Decoder 501 may decode the noisy version of data symbols $X_i$ and $Y_i$ according to a decoding process such as MAP as explained and shown. Decoder 501 produces estimates of data symbols $X_i$ at an output 550. Decoder 502 decodes the noisy version of data symbols $Z_k$ and $X_k$ according to a decoding process such as MAP as explained and shown. Decoder 502 produces estimates of data symbols $X_k$ at an output 560. The decoding processes in decoders 501 and 502 may be performed sequentially. The information may pass from decoder 501 to decoder 502 after completing each iteration. One ordinary skilled in the art may appreciate that the decoders in various embodiments as described and shown operate on the noisy version of the encoded data symbols.

To increase confidence for the estimate of the data symbols $X_i$ to hold a true value, the estimate of data symbols $X_i$ at output 550 may pass through an interleaver 530 to produce estimates of data symbols $X_k$ at an input 532 of decoder 502. Decoder 502 uses the estimates of data symbols $X_k$ at input 532 with estimates of data symbols at input 540 to produce new estimates of data symbols $X_k$ at output 560. Estimates of data symbols $X_k$ at output 560 pass through a de-interleaver 531 to reverse the process of interleaving function of interleaver 430 in the turbo code 400, and to produce estimates of data symbols $X_i$ at an input 541. Estimates of data symbols $X_i$ at input 541 are used with the estimates of data symbols at input 542 to produce a new estimate of data symbols $X_i$ at output 550. The process may be repeated until confidence for the estimate of data symbols $X_i$ reaches an acceptable level. As such, the process for decoding data symbols $X_i$ is time consuming and may not produce an accurate estimate of the data symbols $X_i$ in a timely manner for an application in the communication system 10.

Figure 6:
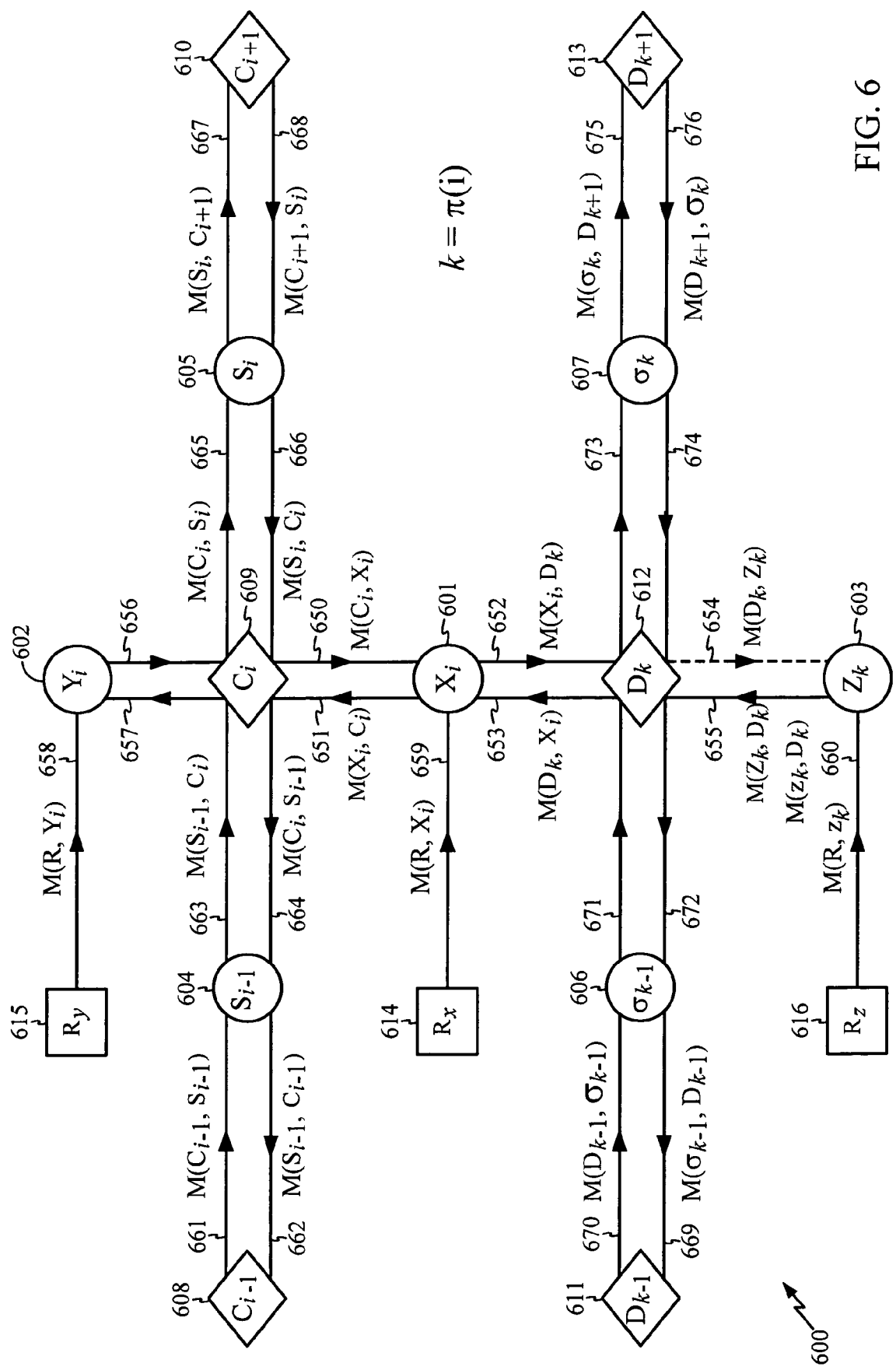
FIG. 6 illustrates a graph for flow of information between various types of nodes for decoding a sequence of encoded data symbols in accordance with various embodiments of the invention.

Referring to FIG. 6, a graph 600 represents signal and information flow in a decoder in accordance with various embodiments of the invention that may be used in communication system 10. The decoding operation depicted in graph 600 is suitable for decoding a sequence of data symbols that has been encoded in a transmitter in accordance with the turbo code. The turbo encoder 400 shown in FIG. 4 is an exemplary embodiment for encoding a sequence of data symbols in accordance with the turbo code. A decoder, such as decoder 20, incorporating an embodiment of the invention greatly benefits from various aspects of the invention. An embodiment of the invention provides a fast decoding operation for determining accurate estimates of data symbols $X_i$ with high confidence. To follow various aspects of signal and information flow in graph 600 in accordance with various embodiments of the invention, several notations may be defined. A sequence of data symbols formed by data symbols $X_i$ may be of a length N binary symbols. The value for N may be any finite number. The time index for first constituent code 401 may be "I," for "i" having a value between 1 and N. The data symbols $Y_i$ and $Z_k$ may also be of a length N binary symbols. The time index for second constituent code 402 may be "k", for "k" having a value between 1 and N. The value for "k" is an image of time index "i" after the interleaving in code interleaver 403.

Referring to FIG. 6, a symbol $X_i$ node 601 may be a symbol node associated with the data symbols at the input of first constituent code 401 at time "i." A symbol $Y_i$ node 602 may be a symbol node associated with the data symbols at the output of first constituent code 401 at time "i." A symbol $Z_k$ node 603 may be a symbol node associated with the data symbols at the output of second constituent code 402 at time "k". The state nodes of the trellis associated with first constituent code 401 at times "i−1" and "i" may be represented by respectively a state $S_{i-1}$ node 604 and a state $S_i$ node 605. The state nodes of the trellis associated with second constituent code 402 at times "k−1" and "k" may be represented respectively by a state $\sigma_{k-1}$ node 606 and a state $\sigma_k$ node 607. The computational nodes associated with the first constituent code 401 at times "i−1" "i" and "i+1" may be respectively represented by a $C_{i-1}$ node 608, a $C_i$ node 609 and a $C_{i+1}$ node 610. The computational nodes associated with the second constituent code 402 at times "k−1", "k" and "k+1" may be represented respectively by a $D_{k-1}$ node 611, a $D_k$ node 612 and a $D_{k+1}$ node 613. A channel $R_x$ node 614 is associated with the received data symbols $X_i$. A channel $R_y$ node 615 is associated with the received data symbols $Y_i$. A channel $R_z$ node 616 is associated with the received data symbols $Z_k$. It should be noted that in addition to the various branches shown in FIG. 6 and specifically mentioned in the following paragraphs, the graph 600 also includes branches 655, 656, 658, 660, 661, 662, 663, 664, 669, 670, 671, 672, 673, 674, 675, and 676. These branches represent information flow between various nodes of the decoder, as shown.

In graph 600, a branch may connect two nodes. A branch may carry a message from a source node to a destination node. In general, if α and β are any two nodes, the notation M(α,β) denotes a message from a node α to a node β. For example, a branch 651 may connect a symbol node, such as $X_i$ node 601, to a computational node, such as $C_i$ node 609. The branch 651 may carry a message from a source node, $X_i$ 601, to a destination node, $C_i$ node 609. Therefore, the message carried by the branch 651 is denoted as $M(X_i, C_i)$. The branches connected to symbol node 601, symbol node 602 and symbol node 603 carry a message consisting of a single number. A branch connected to a symbol node may be realized in hardware, firmware or software, or a combination thereof, as a register or variable, or combination thereof. The value held by the register or the variable may represent the message carried by the branch.

The branches connected to state $S_i$ node 605, state $S_{i-1}$ node 604, state $\sigma_{k-1}$ node 606 and state $\sigma_k$ 607 node carry a message consisting of an array of numbers. The array of numbers may have a length equal to the number of states in a trellis associated with the connecting state node. The encoder associated with the corresponding constituent code may establish the number of states. For example, the constituent code 401 has four states in each state space at each instance of time. Therefore, the array of numbers consists of four numbers, a number for each state in the state space. A branch connected to a state node may be realized in hardware, firmware or software, or a combination thereof, as an array of registers or variables, or combination thereof. The value held by the registers or the variables may represent the message carried by the branch.

Generally, a node may be realized in hardware in a form of a logic circuit with a number of inputs and outputs. The node may also be realized in software/firmware in a form of a function or subroutine. A node may not necessarily store or hold any information at any time. A node may be "updated" by an incoming message. When a node is "updated," the node outputs a message on all of its outgoing branches based on the current value of the messages at its incoming branches. The type of messages on the outgoing branches of a node also depends on the type of the node.

The channel nodes 614, 615 and 616 are updated by receiving a channel output associated wit the corresponding data symbols. A correlator in the demodulator 19 may output the channel output for each data symbol. For example, channel outputs associated with data symbols $X_i$, $Y_i$ and $Z_k$ update respectively channel nodes 614, 615 and 616. When a channel node is updated, a message is passed from the channel node to the associated symbol node. For example, in case of data symbol $X_i$, after receiving an $X_i$ channel output at channel node 614 associated with data symbol $X_i$, channel node 614 is updated by passing a message from the channel node 614 to symbol node 601. The message passed from channel node 614 to symbol node 601 may be equal to the log-likelihood ratio:

$$M(R, x_i) = \log\left(\frac{P(x_i = 1|R)}{P(x_i = 0|R)}\right)$$

of the symbol $X_i$ channel output. For example, if the symbol $X_i$ is BPSK modulated such chat 1 is transmitted as a positive voltage, and 0 is transmitted as a negative voltage, and received over an AWGN channel as a voltage, represented by the real number $r_i$, then the message may be equal to:

$$M(R, x_i) = \log\left(\frac{P(x_i = 1|r_i)}{P(x_i = 0|r_i)}\right) = 4\left(\frac{E_s}{N_o}\right) \cdot r_i,$$

where $E_s/N_o$ represents the symbol SNR of the channel. For a data symbol at an instance of time, the channel node need only be updated once. The channel node may be updated by receiving the channel output.

A symbol node may be updated by receiving a message on a connecting branch. A symbol node may be connected to a number of nodes. For example, symbol node $X_i$ 601 is connected to channel node 614, $C_i$ node 609 and $D_k$ node 612. When a symbol node is updated, the outgoing messages are determined by a summation of the incoming messages. The following notation may be helpful. When a symbol node α is updated, the outgoing messages from symbol node a are evaluated as follows:

$$M(\alpha, \beta) = \sum_{\beta' \neq \beta} M(\beta', \alpha).$$

The summation is over all incoming messages from other nodes (β') that are connected to the node α. The incoming message M(β,α) from the node β that triggered the update of node α is not used in determining the outgoing message M(α,β) from node α to node β. In case of symbol node $X_i$ 601, the node gets updated when the messages are received on the incoming branches 650, 653 and 659. The branch 650 carries a message $M(C_i, X_i)$ from $C_i$ node 609. The branch 653 carries a message $M(D_k, X_i)$ from $D_k$ node 612. The branch 659 carries a message $M(R, X_i)$ from channel node 614. The outgoing message to $C_i$ node 609 is carried on branch 651. The outgoing message to $D_k$ node 612 is carried on branch 652. If the updated is due to receiving a message $M(C_i, X_i)$ on branch 650, an outgoing message $M(X_i, C_i)$ is not sent on branch 651, therefore, only the outgoing message $M(X_i, D_k)$ on branch 652 is sent. There is no outgoing message from the symbol nodes to the channel nodes. If the update is due to receiving a message $M(R, X_i)$ on branch 659, the message sent on branch 652 to $D_k$ node 612 would have a contribution from the message $M(R, X_i)$ from channel node $R_x$ 614 and message $M(C_i, X_i)$ from $C_i$ node 609. Similarly, if the update is due to receiving a message $M(R, X_i)$ on branch 659, the message sent on branch 651 to $C_i$ node 609 would have a contribution from the message $M(R, X_i)$ from channel node $R_x$ 614 and message $M(D_k, X_i)$ from $D_k$ node 612.

In one embodiment, the incoming messages associate with a common instance of time are arrived essentially at the same time at a node. Therefore, the outgoing message is triggered by having all the incoming messages associated with a common instance of time. An incoming message associated with an instance of time does not trigger an outgoing message associated with another instance of time when the messages are not arrived at each node at essentially the same time.

A state node may also be updated by receiving a message on the connected branches. To update a state node, the state node passes a message received from a connected computational node on an incoming branch to another connected computational node on an outgoing branch. The state nodes are connected only to the computational nodes. The state nodes basically pass the incoming messages from a computational node to another computational node. The state $S_i$ node 605 is connected to computational $C_i$ node 609 and $C_{i+1}$ node 610. The state $S_{i-1}$ node 604 is connected to $C_{i-1}$ node 608 and $C_i$ node 609. When state $S_i$ node 605 is updated by receiving a message $M(C_i, S_i)$ on an incoming branch 665 from $C_i$ node 609, the message $M(C_i, S_i)$ is passed on as a message $M(S_i, C_{i+1})$ on an outgoing branch 667 to $C_{i+1}$ node 610. When state $S_i$ node 605 is updated by receiving a message $M(C_{i+1}, S_i)$ on an incoming branch 668, the message $M(C_{i+1}, S_i)$ is passed on as a message $M(S_i, C_i)$ on an outgoing branch 666 to $C_i$ node 609. Similar operations are performed when updating state $S_{i-1}$ node 604, state $\sigma_k$ 607 and state $\sigma_{k-1}$ node 606.

In order to describe the evaluation of the outgoing message at a computation node, some notations related to the trellis associated with the constituent codes are described. Each branch of the trellis connects a state s to a state t, and is labeled with 2 binary symbols in case of the first and second constituent codes 401 and 402. Only certain pairs of states are connected in the trellis. Each branch in the trellis associated with the first constituent code 401 is denoted as (f[s,t], g[s,t]). Similarly, each branch of the trellis associated with the second constituent code 402 is connecting a state s to a state t is denoted as (f'[s,t], g'[s,t]). The f[s,t] represents the systematic symbols (i.e. $X_i$) and g[s,t] represents the parity symbols (i.e $Y_i$ and $Z_k$) associated with the first constituent code 401. The f'[s,t] represents the systematic symbols (i.e. $X_i$) and g'[s,t] (i.e $Y_i$ and $Z_k$) represents the parity symbols associated with the second constituent code 402. One ordinary skilled in the art may appreciate that the data symbols $X_i$ are systematic symbols and $Y_i$ and $Z_k$ are parity symbols associated with a turbo code.

The outgoing messages from the computation nodes to the state nodes are in a form of an array of numbers. The state nodes pass messages from one computational node to another, as explained. Therefore, the outgoing messages from the state nodes are also in a form of an array of numbers. The length of the array is equal to the number of states in each state space of the trellis. For example, in case of the message $M(C_i, S_i)$ from computational node $C_i$ 609 to state $S_i$ node 605, the $M(C_i, S_i)[s]$ denote the $s^{th}$ component of the array of numbers in message $M(C_i, S_i)$. Similarly, $M(S_i, C_i)[s]$ denotes the $s^{th}$ component of the message $M(S_i, C_i)$ from the state node to the computation node. The outgoing messages from the computation C, node 609 are evaluated as follows:

$$M(C_i, S_i)[t] = \log\left[\sum_s \exp[M(S_{i-1}, C_i)[s] + f[s,t]M(x_i, C_i) + g[s,t]M(y_i, C_i)]\right]$$

$$M(C_i, S_{i-1})[s] = \log\left[\sum_t \exp[M(S_i, C_i)[t] + f[s,t]M(x_i, C_i) + g[s,t]M(y_i, C_i)]\right]$$

$$M(C_i, x_i) = \log\left[\sum_{f(s,t)=1} \exp[M(S_{i-1}, C_i)[s] + M(S_i, C_i)[t] + g[s,t]M(y_i, C_i)]\right] - \log\left[\sum_{f(s,t)=0} \exp[M(S_{i-1}, C_i)[s] + M(S_i, C_i)[t] + g[s,t]M(y_i, C_i)]\right]$$

where the summation is restricted to the states s and t such that there is a branch in the trellis from state s to state t. An outgoing message from Computational $C_i$ node 609 to symbol node $Y_i$ 602 may not exist even though a branch 657 (in dotted line) is shown. Since symbol node $Y_i$ 602 sends a message to only $C_i$ node 609, the node $Y_i$ 602 does not receive a message from $C_i$ node 609. Similarly, the messages from the computation node $D_k$ 612 are evaluated as follows:

$$M(D_k, \sigma_k)[t] = \log\left[\sum_s \exp[M(\sigma_{k-1}, D_k)[s] + f'[s,t]M(x_k, C_k) + g'[s,t]M(z_k, D_k)]\right]$$

$$M(D_k, \sigma_{k-1})[t] = \log\left[\sum_t \exp[M(\sigma_k, D_k)[t] + f'[s,t]M(x_k, C_k) + g'[s,t]M(z_k, D_k)]\right]$$

$$M(D_k, x_k)[t] = \log\left[\sum_{f'(s,t)=1} \exp[M(\sigma_{k-1}, D_k)[s] + M(\sigma_k, D_k)[t] + g'[s,t]M(z_k, D_k)]\right] - \log\left[\sum_{f'(s,t)=0} \exp[M(\sigma_{k-1}, D_k)[s] + M(\sigma_k, D_k)[t] + g'[s,t]M(z_k, D_k)]\right]$$

An outgoing message from computational node Dk 609 to symbol node $Z_k$ may not exist even though a branch 654 (in dotted line) is shown. Since symbol node $Z_k$ 603 sends a message to only $D_k$ node 612, the node $Z_k$ 603 does not receive a message from $D_k$ node 612.

The above computation uses the basic mathematical operation commonly defined by $$\phi(u_1, u_2, \cdots, u_n) = \log\left[\sum_{i=1}^n \exp(u_i)\right].$$

It may be easily seen that the above n-array operation may be realized as concatenation of binary operations $$\phi(u_1, u_2, \ldots, u_n) = \phi(u_1, \phi(u_2, \phi(u_3, \ldots, \phi(u_{n-1}, u_n))))$$

Furthermore, the binary operation may be realized as $$\phi(u_1, u_2) = \text{Max}(u_1, u_2) + \log[1 + \exp(-|u_1 - u_2|)] = \text{Max}(u_1, u_2) + \psi(|u_1 - u_2|)$$

In practice, the function $\psi(|u_1 - u_2|)$ is approximated using a small lookup table. When a computation node is "triggered," the following steps may occur in sequence: (1) all the state nodes and symbol nodes connected to the computation node are updated, and (2) the computation node itself is updated.

The message passing decoding algorithm in accordance with various embodiments consists of updating all the channel nodes once, and then triggering the computation nodes according to a triggering schedule. Typically, the computation nodes are triggered according to the schedule several times, during the decoding process. The outgoing messages from computation nodes are initialized and update triggers are scheduled.

For the initialization process, the messages from all the computation nodes to the symbol nodes are initialized to 0. Each component of the outgoing messages from all the computation nodes to state nodes are initialized to $-\log(M)$, where M is the number of states in each state space of the trellis. If the constituent encoders are known to be in the zero state prior to encoding, then the process initializes, at time "0," $M(C_0, S_0)[0] = M(D_0, \sigma_0)[0] = 0$ and $M(C_0, S_0)[s] = M(D_0, \sigma_0)[s] = -\infty$ for all non-zero states s in the trellis sections. Similarly, if the constituent encoders are known to be in the zero state at the end of encoding, the process may initialize $M(C_{N+1}, S_N)[0] = M(D_{N+1}, \sigma_N)[0] =$ and $M(C_{N+1}, S_N)[S] = M(D_{N+1}, \sigma_N)[S] = -\infty$ for all non-zero states s.

Figure 7:
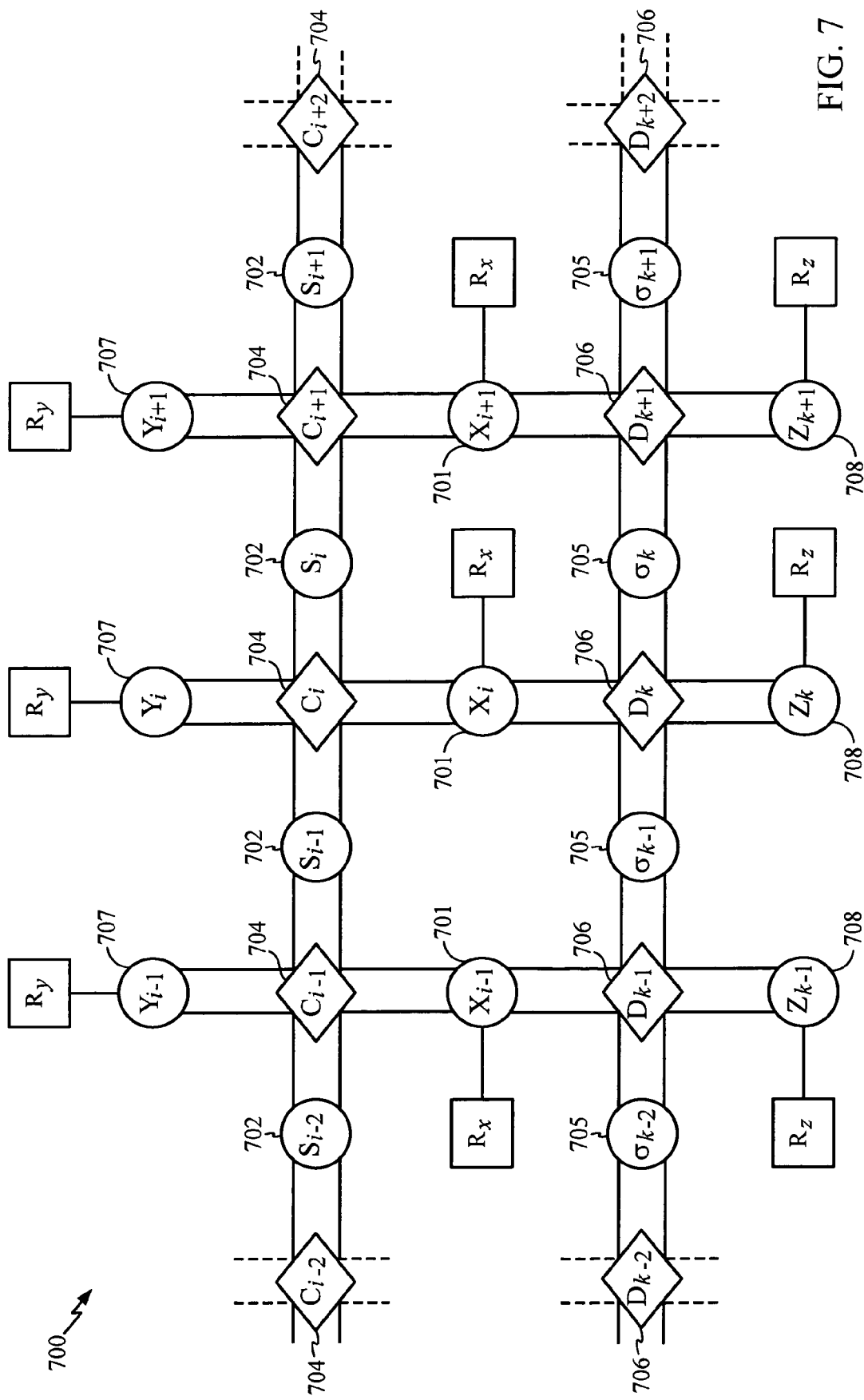
FIG. 7 illustrates a generalized graph for flow of information between various types of nodes for decoding a sequence of encoded data symbols in accordance with various embodiments of the invention.

Referring to FIG. 7, a graph 700 depicts flow of messages between different nodes corresponding to different instances of time in accordance with various embodiments of the invention. The channel output associated with encoded data symbols $X_i$, $Y_i$ and $Z_k$ may be stored in a memory element in demodulator 19. As such, the channel output associated with encoded data symbols $X_i$, $Y_i$ and $Z_k$ for different time instances may be available all at the same time for the decoding process. The channel outputs associated with data symbols $X_{i-1}$, $X_i$ and $X_{i+1}$ corresponding to time instances "i−1", "i" and "i+1" are passed on to symbol nodes 701. The state $S_{i-2}$, $S_{i-1}$, $S_i$ and $S_{i+1}$ nodes 702 may also be formed to connect the computational $C_{i-2}$, $C_{i-1}$, $C_i$, $C_{i+1}$, and $C_{i+2}$ nodes 704. The state $\sigma_{k-2}$, $\sigma_{k-1}$, $\sigma_k$ and $\sigma_{k+1}$ nodes 705 may also be formed to connect the computational $D_{k-2}$, $D_{k-1}$, $D_k$, $D_{k+1}$, and $D_{k+2}$ nodes 706. The channel outputs associated with data symbols $Y_{i-1}$, $Y_i$ and $Y_{i+1}$ corresponding to time instances "i−1", "i" and "i+1" are passed on to symbol nodes 707. The channel outputs associated with data symbols $Z_{k-1}$, $Z_k$ and $Z_{k+1}$ corresponding to time instances "k−1," "k" and "k+1"

are passed on to symbol nodes 708. Although the graph 700 depicts the message passing flow corresponding to three instances of time, one ordinary skilled in the art may appreciate that the graph 700 may be expanded to included all the time instances for 1 through N. In accordance with an embodiment, all the computation nodes 704 and 706 may be triggered essentially concurrently. As such, in one step all the computational nodes are once updated. Each time all the computational nodes are updated, the decoding process may have completed on decoding iteration. The concurrent trigger of the computational nodes 704 and 706 may be repeated to achieve one or more iterations of the decoding process.

In another embodiment, the computational nodes may be triggered in a sequence of $C_0, C_1, C_2, \ldots, C_N, C_{N-1}, C_{N-2}, C_{N-3}, \ldots C_2, C_1, C_0, D_0, D_1, D_2, \ldots, D_N, D_{N-1}, D_{N-2}, D_{N-3}, \ldots D_2, D_1, D_0$, to obtain a single iteration of the traditional turbo decoding algorithm with the full MAP decoding. The sequence of computation nodes $C_0, C_1, C_2, \ldots, C_N$ may be divided into several overlapping sub-blocks, and the nodes are triggered sequentially within each sub-block, but concurrently across all sub-blocks. A close approximation to the sliding block MAP decoding of the first constituent code may be obtained. The nodes $D_0, D_1, D_2, \ldots, D_N$ may be triggered in the same manner to obtain an approximation of the standard turbo decoding algorithm with sliding block MAP decoding.

In general, an arbitrary collection of (overlapping) subsets of computation nodes may be defined, and the sequence in which subsets are triggered may also be defined. Within each subset, the nodes may be triggered in any order, or in concurrence. Alternatively, a sequence may be specified to accord a trigger of each computation node in a subset. Different subsets may be triggered in any order, or in concurrence. When all the computational nodes are triggered once, a decoding iteration is defined to take place. A complete decoding process may include several iterations. After several iterations of triggering the computation nodes of the first constituent code, the computation nodes of the second constituent code may be triggered similarly. The process may also be complete after a predefined number of iterations in accordance with an embodiment. The process may also be complete after a number of iterations in a dynamic fashion in accordance with an embodiment. The process is complete when an acceptable set of systematic data symbols $(X_i)$ are produced at an acceptable quality level. The value of data symbols $X_i$ at the symbol node $X_i$ 601 may pass through a cyclic redundancy check (CRC) after each iteration. If the CRC passes, the decoding operation may be complete, and no additional iteration may be necessary.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination. A software module may reside in Random Access Memory (RAM), flash memory, Read Only Memory (ROM), Erasable Programmable Read Only Memory (EPROM), Electrically Erasable Programmable Read Only Memory (EEPROM), registers, hard disk, a removable disk, a Compact Disk Read Only Memory (EEPROM), or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. In a communication system, a method for decoding a sequence of turbo encoded data symbols transmitted over a channel comprising:

updating channel nodes $R_x$, $R_y$ and $R_z$ based on a received channel output;

initializing outgoing messages from symbol nodes $X_i$, $Y_i$ and $Z_k$, wherein said symbol nodes $X_i$, $Y_i$ and $Z_k$ are in communication with said channel nodes $R_x$, $R_y$ and $R_z$;

triggering updates of computational nodes C and D, associated with different instances of time, in accordance with a triggering schedule, wherein a computational node $C_i$ is in communication with said symbol nodes $X_i$ and $Y_i$ and a computational node $D_k$ is in communication with said symbol nodes $X_i$ and $Z_k$; and partitioning said computational node C at time instances $C_0, C_1, C_2, \ldots, C_N$ into at least two subsets, wherein said triggering schedule includes triggering updates of computational nodes C in a sequence at different time instances in each subset, and wherein said triggering of computational node C at different time instances in said at least two subsets occurs concurrently.

2. The method as recited in claim 1 further comprising:

determining said sequence at different time instances in each subset for said triggering updates.

3. The method as recited in claim 1 wherein said least two subsets of computational node C at different time instances $C_0, C_1, C_2, \ldots, C_N$ have at least one common computational node time instance.

4. The method as recited in claim 1 further comprising:
partitioning computational node D at different time instances $D_0, D_1, D_2, \ldots, D_N$ into at least two subsets, wherein said triggering schedule includes triggering computational nodes D at different time instances in a sequence in each subset.

5. The method as recited in claim 4 further comprising:
determining said sequence at different time instances in each subset for said triggering updates.

6. The method as recited in claim 4 wherein said triggering of computational node D at different time instance in said least two subsets occurs concurrently.

7. The method as recited in claim 4 wherein said subsets of computational node D at time instances $D_0, D_1, D_2, \ldots, D_N$ have at least one common computational node time instance.

8. An apparatus for decoding a sequence of turbo encoded data symbols communicated over a channel comprising:
channel nodes $R_x$, $R_y$, and $R_z$ for receiving channel output;
symbol nodes $X_i$, $Y_i$ and $Z_k$ in communication with said channel nodes $R_x$, $R_y$ and $R_z$;
state nodes $S_i$ and $S_{i-1}$ associated with a first constituent code in a turbo code;
state nodes $\sigma_k$ and $\sigma_{k-1}$ associated with a second constituent code in said turbo code;
a computational node $C_i$ in communication with said symbol nodes $X_i$ and $Y_i$;
a computational node $D_k$ in communication with said symbol nodes $X_i$ and $Z_k$, wherein said computational node $C_i$ is in communication with said state nodes $S_i$ and $S_{i-1}$ and said computational node $D_k$ is in communication with said state nodes $\sigma_k$ and $\sigma_{k-1}$;
a computational node $C_{i+1}$ in communication with said state node $S_i$;
a computational node $C_{i-1}$ in communication with said state node $S_{i-1}$;
a computational node $D_{K+1}$ in communication with said state node $\sigma_k$; and
a computational node $D_{k-1}$ in communication with said state node $\sigma_{k-1}$;
wherein computational nodes C and D at different time instances are configured for updates in accordance with an update triggering schedule, said update triggering schedule including concurrent triggering of each node of a first plurality of said computational nodes C, and concurrent triggering of each node of a second plurality of computational nodes D.

9. The apparatus as recited in claim 8, wherein said update triggering schedule includes triggering updates in a sequence in a partitioned computational nodes $C_0, C_1, C_2, \ldots, C_N$ of at least two subsets and in a sequence in a partitioned computational nodes $D_0, D_1, D_2, \ldots, D_N$ of at least two subsets.

10. The apparatus as recited in claim 8 wherein said sequence of turbo encoded data symbols includes "N" number of symbols, wherein each symbol in said sequence is identified by either a subscript "i" or "k" corresponding to the subscripts used for said state nodes and said computational nodes.

11. A processor configured for decoding a sequence of turbo encoded data symbols for communication over a channel comprising:
channel nodes $R_x$, $R_y$, and $R_z$ for receiving channel output;
symbol nodes $X_i$, $Y_i$ and $Z_k$ in communication with said channel nodes $R_x$, $R_y$ and $R_z$;
state nodes $S_i$ and $S_{i-1}$ associated with a first constituent code in a turbo code;
state nodes $\sigma_k$ and $\sigma_{k-1}$ associated with a second constituent code in said turbo code;
a computational node $C_i$ in communication with said symbol nodes $X_i$ and $Y_i$;
a computational node $D_k$ in communication with said symbol nodes $X_i$ and $Z_k$, wherein said computational node $C_i$ is in communication with said state nodes $S_i$ and $S_{i-1}$ and said computational node $D_k$ is in communication with said state nodes $\sigma_k$ and $\sigma_{k-1}$;
a computational node $C_{i+1}$ in communication with said state node $S_i$;
a computational node $C_{i-1}$ in communication with said state node $S_{i-1}$;
a computational node $D_{K+1}$ in communication with said state node $\sigma_k$; and
a computational node $D_{k-1}$ in communication with said state node $\sigma_{k-1}$;
wherein computational nodes C and D at different time instances are configured for updates in accordance with an update triggering schedule, said update triggering schedule including concurrent triggering of each node of a first plurality of said computational nodes C, and concurrent triggering of each node of a second plurality of computational nodes D.

12. The processor as recited in claim 11 wherein said update triggering schedule includes triggering updates of said computational nodes C and D in a sequence of $C_0, C_1, C_2, \ldots, C_N, C_{N-1}, C_{N-2}, C_{N-3}, \ldots C_2, C_1, C_0, D_0, D_1, D_2, \ldots, D_N, D_{N-1}, D_{N-2}, D_{N-3}, \ldots D_2, D_1, D_0$.

13. The processor as recited in claim 11 wherein said sequence of data includes "N" number of symbols, wherein each symbol in said sequence is identified by either a subscript "i" or "k" corresponding to the subscripts used for said state nodes and said computational nodes.

* * * * *